US009035318B2

(12) United States Patent
Pendharkar et al.

(10) Patent No.: US 9,035,318 B2
(45) Date of Patent: May 19, 2015

(54) AVALANCHE ENERGY HANDLING CAPABLE III-NITRIDE TRANSISTORS

(71) Applicant: Texas Instruments Incorporated, Dallas, TX (US)

(72) Inventors: Sameer Pendharkar, Allen, TX (US); Naveen Tipirneni, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 155 days.

(21) Appl. No.: 13/886,378

(22) Filed: May 3, 2013

(65) Prior Publication Data

US 2014/0327010 A1    Nov. 6, 2014

(51) Int. Cl.
*H01L 29/15* (2006.01)
*H01L 27/02* (2006.01)
*H01L 29/20* (2006.01)
*H01L 29/267* (2006.01)
*H01L 29/778* (2006.01)
*H01L 29/10* (2006.01)
*H01L 29/78* (2006.01)
*H01L 49/02* (2006.01)

(52) U.S. Cl.
CPC ........ *H01L 27/0255* (2013.01); *H01L 29/2003* (2013.01); *H01L 29/267* (2013.01); *H01L 29/7833* (2013.01); *H01L 29/7787* (2013.01); *H01L 28/20* (2013.01); *H01L 29/1029* (2013.01)

(58) Field of Classification Search
CPC ............ H01L 29/2003; H01L 2924/00; H01L 2924/00014; H01L 21/0254; H01L 2924/0002
USPC ............ 257/76, 192, 615, E21.127, E29.242
See application file for complete search history.

(56) References Cited

U.S. PATENT DOCUMENTS

| | | | | |
|---|---|---|---|---|
| 2011/0279185 | A1* | 11/2011 | Lautzenhiser | 330/296 |
| 2012/0049973 | A1* | 3/2012 | Smith et al. | 333/103 |
| 2012/0206169 | A1* | 8/2012 | Kimura | 327/109 |
| 2012/0206170 | A1* | 8/2012 | Kimura et al. | 327/109 |
| 2013/0215653 | A1* | 8/2013 | Kihara | 363/56.01 |
| 2013/0241621 | A1* | 9/2013 | Forghani-Zadeh et al. | 327/315 |

* cited by examiner

*Primary Examiner* — Andy Huynh
(74) *Attorney, Agent, or Firm* — Jacqueline J. Garner; Frank Cimino

(57) ABSTRACT

A semiconductor device includes a GaN FET with an overvoltage clamping component electrically coupled to a drain node of the GaN FET and coupled in series to a voltage dropping component. The voltage dropping component is electrically coupled to a terminal which provides an off-state bias for the GaN FET. The overvoltage clamping component conducts insignificant current when a voltage at the drain node of the GaN FET is less than the breakdown voltage of the GaN FET and conducts significant current when the voltage rises above a safe voltage limit. The voltage dropping component is configured to provide a voltage drop which increases as current from the overvoltage clamping component increases. The semiconductor device is configured to turn on the GaN FET when the voltage drop across the voltage dropping component reaches a threshold value.

10 Claims, 11 Drawing Sheets

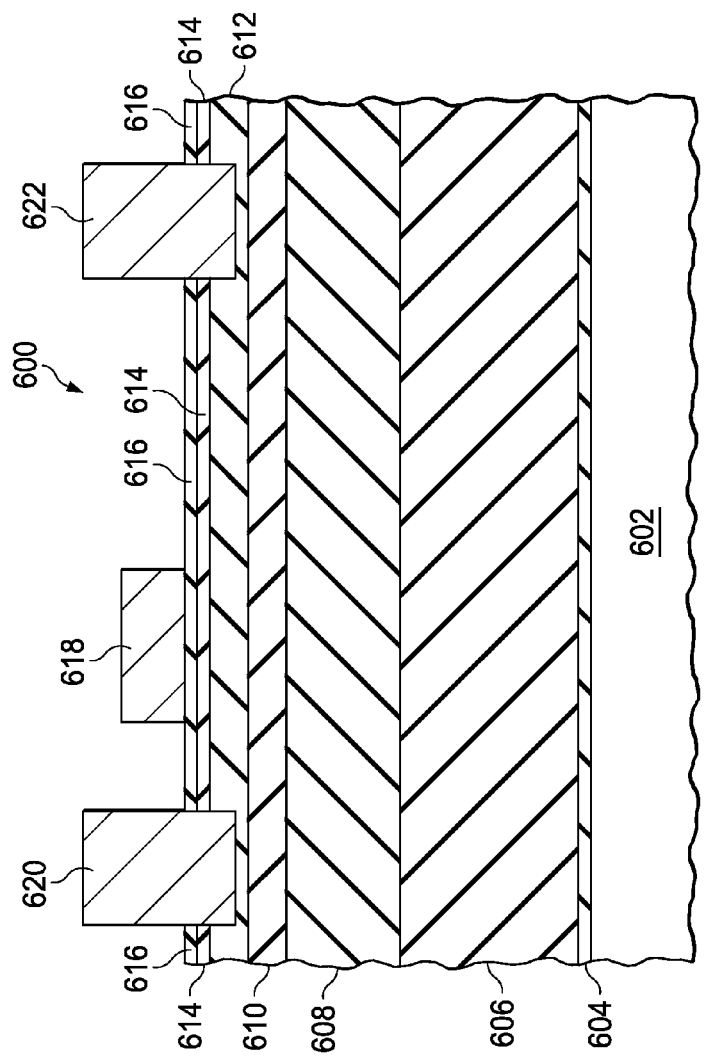
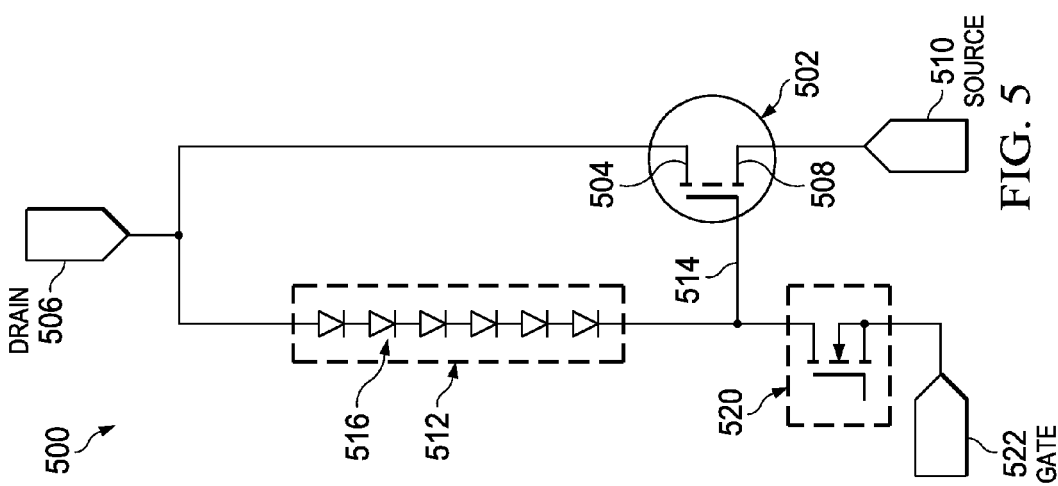
FIG. 6
FIG. 5

US 9,035,318 B2

AVALANCHE ENERGY HANDLING CAPABLE III-NITRIDE TRANSISTORS

FIELD OF THE INVENTION

This invention relates to the field of semiconductor devices. More particularly, this invention relates to gallium nitride FETs in semiconductor devices.

BACKGROUND OF THE INVENTION

Field effect transistors (FETs) made of III-N materials such as GaN exhibit desirable properties for power switches, such as high bandgaps and high thermal conductivity compared to silicon FETs. However, GaN FETs are susceptible to damage when operated in a breakdown condition, which may occur in unclamped inductive switching operation.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device includes a GaN FET with an overvoltage clamping component electrically coupled at one end to a drain node of the GaN FET. Another end of the overvoltage clamping component is electrically coupled to a first end of a voltage dropping component. A second end of the voltage dropping component is electrically coupled to a terminal for a bias potential which provides an off-state bias for the GaN FET. The overvoltage clamping component is configured to conduct insignificant current when a voltage at the drain node of the GaN FET is less than a safe voltage limit which is less than a breakdown voltage of the GaN FET, for example 80 percent of a breakdown voltage of the GaN FET. The overvoltage clamping component is further configured to conduct significant current when the voltage at the drain node of the GaN FET rises above the safe voltage limit. The voltage dropping component is configured to provide a voltage drop which increases as current from the overvoltage clamping component increases. The semiconductor device is configured to turn on the GaN FET when the voltage drop across the voltage dropping component reaches a threshold value.

During operation of the semiconductor device, when the voltage at the drain node of the GaN FET rises above the safe voltage limit, the overvoltage clamping component conducts significant current which causes the voltage drop across the voltage dropping component to increase above the threshold value, thereby turning on the GaN FET, so that a voltage drop across the GaN FET is maintained below the breakdown voltage.

DESCRIPTION OF THE VIEWS OF THE DRAWING

FIG. 1 through FIG. 5 are circuit diagrams of examples of semiconductor devices containing GaN FETs with overvoltage clamping components and voltage dropping components.

FIG. 6 through FIG. 8 are cross sections of exemplary GaN FETs according to embodiments.

DETAILED DESCRIPTION OF EXAMPLE EMBODIMENTS

Figure 2:
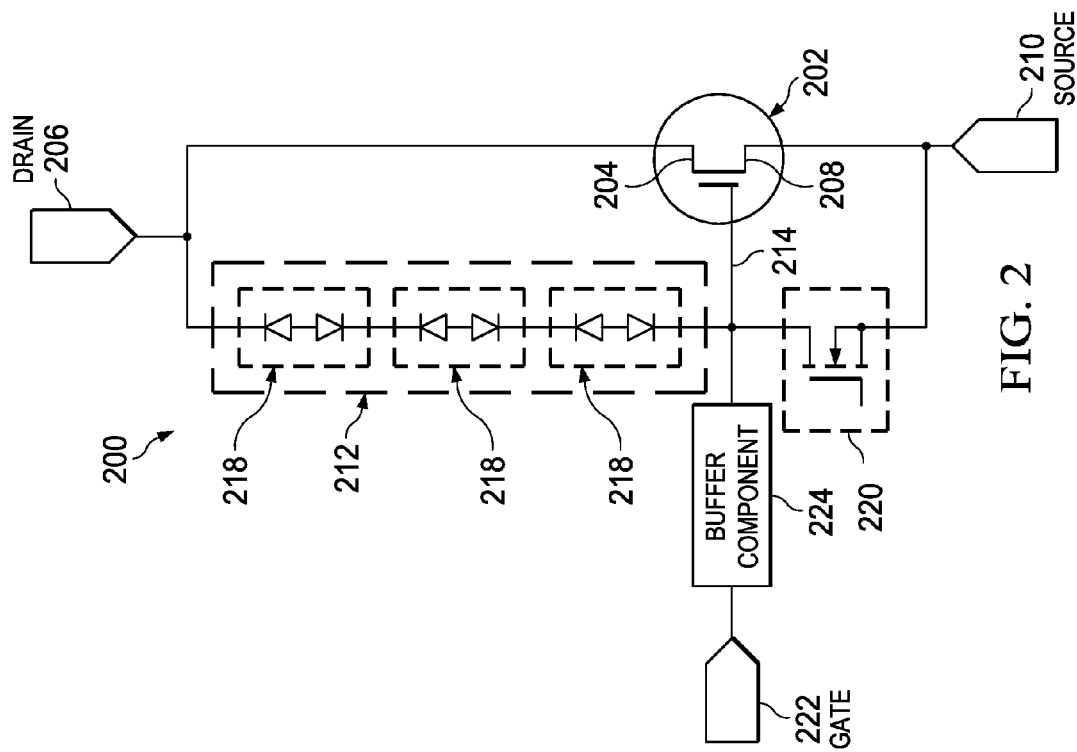

The following co-pending patent applications are related and hereby incorporated by reference:

U.S. patent application Ser. No. 13/886,410, filed May 3, 2013, now U.S. Pat. No. 8,933,461, granted Jan. 13, 2015, and entitled "III-NITRIDE ENHANCEMENT MODE TRANSISTORS WITH TUNABLE AND HIGH GATE-SOURCE VOLTAGE RATING;"

U.S. patent application Ser. No. 13/886,429, filed May 3, 2013, and entitled "III-NITRIDE TRANSISTOR LAYOUT;"

U.S. patent application Ser. No. 13/886,652, filed May 3, 2013, and entitled "LAYER TRANSFER OF SI100 ON TO III-NITRIDE MATERIAL FOR HETEROGENOUS INTEGRATION;"

U.S. patent application Ser. No. 13/886,688, filed May 3, 2013, now U.S. Pat. No. 8,759,879, granted Jun. 24, 2014, and entitled "RESURF III-NITRIDE HEMTS;"

U.S. patent application Ser. No. 13/886,744, filed May 3, 2013, now U.S. Pat. No. 8,829,613, granted Sep. 9, 2014, and entitled "METHOD TO FORM STEPPED DIELECTRIC FOR FIELD PLATE FORMATION;" and U.S. patent application Ser. No. 13/886,744, filed May 3, 2013, now U.S. Pat. No. 8,916,427, granted Dec. 23, 2014, and entitled "GaN DIELECTRIC RELIABILITY ENHANCEMENT."

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device includes a GaN FET with an overvoltage clamping component electrically coupled at one end to a drain node of the GaN FET. Another end of the overvoltage clamping component is electrically coupled to a first end of a voltage dropping component. A second end of the voltage dropping component is electrically coupled to a terminal for a bias potential which provides an off-state bias for the GaN FET. The overvoltage clamping component is configured to conduct insignificant current when a voltage at the drain node of the GaN FET is less than a safe voltage limit which is less than a breakdown voltage of the GaN FET, for example 80 percent of the breakdown voltage of the GaN FET. The overvoltage clamping component is further configured to conduct significant current when the voltage at the drain node of the GaN FET rises above the safe voltage limit. The voltage dropping component is configured to provide a voltage drop which increases as current from the overvoltage clamping component increases. The semiconductor device is configured to turn on the GaN FET when the voltage drop across the voltage dropping component reaches a threshold value.

During operation of the semiconductor device, when the voltage at the drain node of the GaN FET rises above the safe voltage limit, the overvoltage clamping component conducts significant current which causes the voltage drop across the voltage dropping component to increase above the threshold value, thereby turning on the GaN FET, so that a voltage drop across the GaN FET is maintained below the breakdown voltage.

For the purposes of this description, the term "III-N" is understood to refer to semiconductor materials in which group III elements, that is, aluminum, gallium and indium, and possibly boron, provide a portion of the atoms in the semiconductor material and nitrogen atoms provide the remainder of the atoms in the semiconductor material. Examples of III-N semiconductor materials are gallium nitride, boron gallium nitride, aluminum gallium nitride, indium nitride, and indium aluminum gallium nitride. Terms describing elemental formulas of materials do not imply a particular stoichiometry of the elements. III-N materials may be written with variable subscripts to denote a range of possible stoichiometries. For example, aluminum gallium nitride may be written as $Al_xGa_{1-x}N$ and indium aluminum gallium nitride may be written as $In_xAl_yGa_{1-x-y}N$. For the purposes of this description, the term GaN FET is understood to refer to a field effect transistor which includes III-N semiconductor materials.

Figure 1:
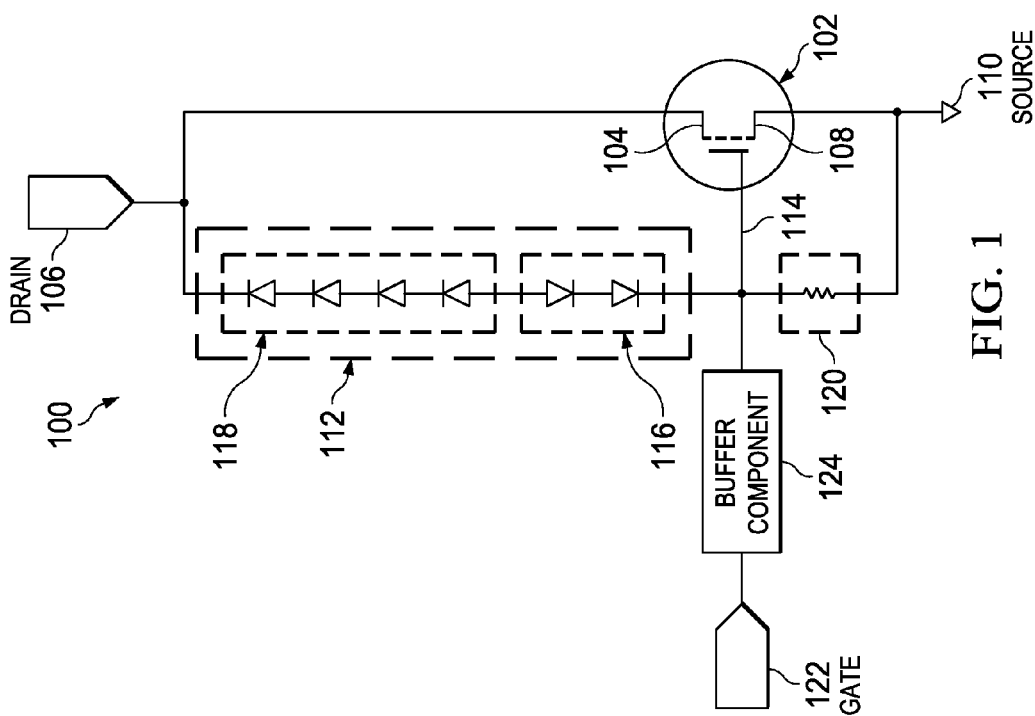

FIG. 1 through FIG. 5 are circuit diagrams of examples of semiconductor devices containing GaN FETs with overvoltage clamping components and voltage dropping components. Referring to FIG. 1, a semiconductor device 100 includes an enhancement mode GaN FET 102 with a drain node 104 of the GaN FET 102 connected to a drain terminal 106 of the semiconductor device 100. A source node 108 of the GaN FET 102 is connected to a source terminal 110 of the semiconductor device 100. In FIG. 1, the semiconductor device source terminal 110 is depicted as a ground terminal. In an alternate version of the instant example, the semiconductor device source terminal 110 may be connected to a voltage source other than ground. A breakdown voltage of the GaN FET 102 may be, for example, 40 volts to 1500 volts.

An overvoltage clamping component 112 is connected between the drain node 104 of the GaN FET 102 and a gate node 114 of the GaN FET 102. In FIG. 1 the overvoltage clamping component 112 is depicted as a plurality of diodes, including forward biased diodes 116 and reverse biased diodes 118. The overvoltage clamping component 112 is configured so that a breakdown voltage of the overvoltage clamping component 112 is less than a breakdown voltage of the GaN FET 102, for example for example 70 percent to 90 percent of the breakdown voltage of the GaN FET 102. The overvoltage clamping component 112 may include, for example, silicon pn junction diodes, silicon schottky diodes, GaN schottky diodes, $Al_xGa_{1-x}N$ schottky diodes or $In_xAl_yGa_{1-x-y}N$ schottky diodes. The overvoltage clamping component 112 conducts significant current when the reverse biased diodes 118 break down.

A voltage dropping component 120 is connected between the gate node 114 and the source terminal 110 of the semiconductor device 100. In FIG. 1, the voltage dropping component 120 is depicted as a resistor. Current from the overvoltage clamping component 112 flows through the voltage dropping component 120. An impedance of the voltage dropping component 120 is selected to provide a desired on-state bias at the gate node 114 when the overvoltage clamping component 112 is in breakdown. A gate terminal 122 of the semiconductor device 100 is electrically coupled to the gate node 114 of the GaN FET 102, possibly through an optional buffer component 124. The buffer component 124 may include, for example a resistor or a diode with an anode coupled to the gate terminal 122 and a cathode coupled to the gate node 114.

During operation of the semiconductor device 100, the GaN FET 102 may be turned off by applying a suitable off-state bias at the gate terminal 122. If a voltage at the drain terminal 106 exceeds the breakdown voltage of the overvoltage clamping component 112, the overvoltage clamping component 112 conducts significant current which flows through the voltage dropping component 120 to provide a desired on-state voltage at the gate node 114, turning on the GaN FET 102. The GaN FET 102 in the on-state drops the voltage at the drain terminal 106 to a safe level so that the GaN FET 102 does not experience breakdown. The blocking component 124 if present may advantageously reduce current between the gate node 114 at the on-state voltage and the gate terminal 122 at the off-state bias.

Referring to FIG. 2, a semiconductor device 200 includes a depletion mode GaN FET 202 with a drain node 204 of the GaN FET 202 connected to a drain terminal 206 of the semiconductor device 200. A source node 208 of the GaN FET 202 is connected to a source terminal 210 of the semiconductor device 200, which may be a ground terminal. A breakdown voltage of the GaN FET 202 may be, for example, 200 volts to 600 volts.

An overvoltage clamping component 212 is connected between the drain node 204 of the GaN FET 202 and a gate node 214 of the GaN FET 202. In FIG. 2 the overvoltage clamping component 212 is depicted as a plurality of forward 216 and reverse 218 diode pairs. The overvoltage clamping component 212 is configured so that a breakdown voltage of the overvoltage clamping component 212 is less than a breakdown voltage of the GaN FET 202, for example as described in reference to FIG. 1. The overvoltage clamping component 212 conducts significant current when the reverse diodes of the diode pairs 218 break down.

A voltage dropping component 220 is connected between the gate node 214 and the source terminal 210 of the semiconductor device 200. In FIG. 2, the voltage dropping component 220 is depicted as a metal oxide semiconductor (MOS) transistor, in this embodiment an n-channel metal oxide semiconductor (NMOS) transistor, for example a silicon NMOS transistor biased into a linear mode. Current from the overvoltage clamping component 212 flows through the voltage dropping component 220. An impedance of the voltage dropping component 220 is selected to provide a desired on-state bias at the gate node 214 when the overvoltage clamping component 212 is in breakdown. A gate terminal 222 of the semiconductor device 200 is electrically coupled to the gate node 214 of the GaN FET 102, possibly through an optional buffer component 224. The buffer component 224 functions as described in reference to the buffer component 124 of FIG. 1.

Operation of the semiconductor device 200 is similar to operation of the semiconductor device 100 discussed in reference to FIG. 1. A gate bias of the NMOS transistor in the voltage dropping component 220 may be adjusted during breakdown of the overvoltage clamping component 212 to provide a desired on-state voltage at the gate node 214 of the GaN FET 202.

Figure 3:
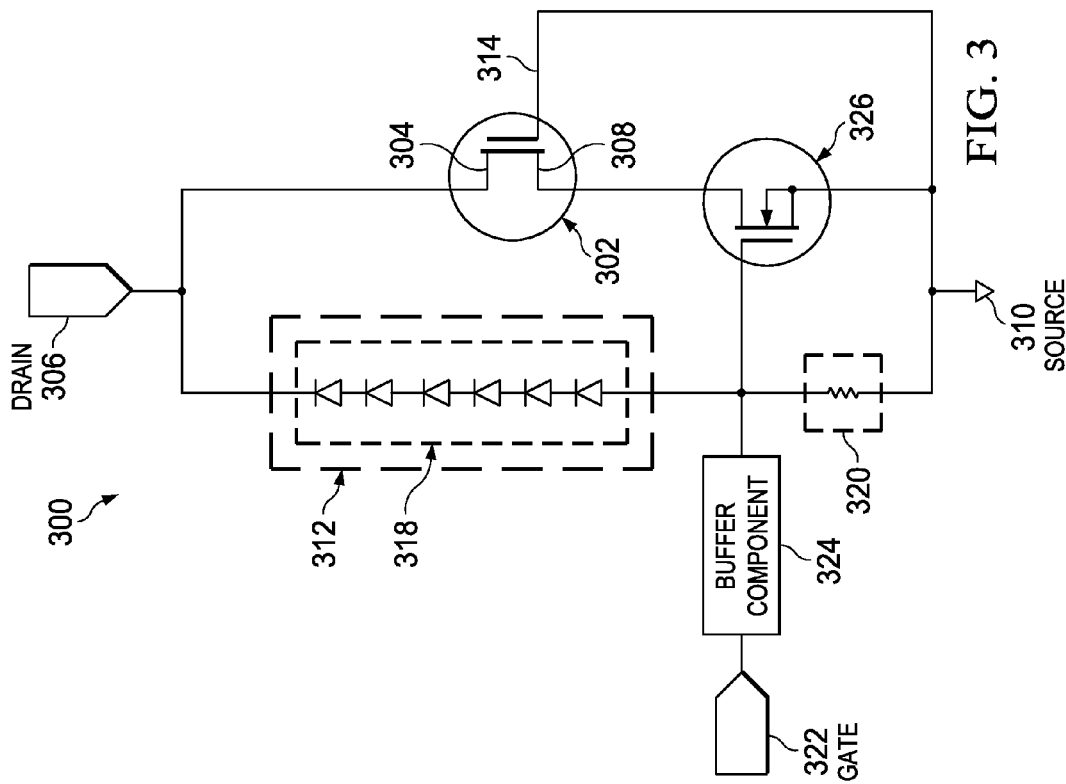

Referring to FIG. 3, a semiconductor device 300 includes a depletion mode GaN FET 302 with a drain node 304 of the GaN FET 302 connected to a drain terminal 306 of the semiconductor device 300. A source node 308 of the GaN FET 302 is connected through an NMOS transistor 326 to a source terminal 310 of the semiconductor device 300, depicted in FIG. 3 as a ground terminal. A gate node 314 of the GaN FET 302 is connected to the source terminal 310. A gate node of the NMOS transistor 326 is electrically coupled to a gate terminal 322 of the semiconductor device 300, possibly through a buffer component 324. A breakdown voltage of the GaN FET 302 may be, for example, 200 volts to 600 volts. A breakdown voltage of the NMOS transistor 326 may be less than 20 volts.

An overvoltage clamping component 312 is connected between the drain node 304 of the GaN FET 302 and the gate node of the NMOS transistor 326. In FIG. 3 the overvoltage clamping component 312 is depicted as a plurality of reverse diodes 318. The overvoltage clamping component 312 is configured so that a breakdown voltage of the overvoltage clamping component 312 is less than a breakdown voltage of the GaN FET 302, for example as described in reference to FIG. 1. The overvoltage clamping component 312 conducts significant current when the diodes 318 break down.

A voltage dropping component 320 is connected between the gate node of the NMOS transistor 324 and the source terminal 310 of the semiconductor device 300. In FIG. 3, the voltage dropping component 320 is depicted as resistor. Current from the overvoltage clamping component 312 flows through the voltage dropping component 320. An impedance of the voltage dropping component 320 is selected to provide a desired on-state bias at the gate node of the NMOS transistor 324 when the overvoltage clamping component 312 is in breakdown.

During operation of the semiconductor device 300, the GaN FET 302 may be turned off by applying a suitable off-state bias at the gate terminal 322 which turns off the NMOS transistor 324, causing a voltage on the source node 308 of the GaN FET 302 to rise, turning off the GaN FET 302. If a voltage at the drain terminal 306 exceeds the breakdown voltage of the overvoltage clamping component 312, the overvoltage clamping component 312 conducts significant current which flows through the voltage dropping component 320 to provide a desired on-state voltage at the gate node of the NMOS transistor 324. When the NMOS transistor 324 turns on, voltage on the source node 308 of the GaN FET 302 drops so that the GaN FET 302 is turned on. The GaN FET 302 in the on-state drops the voltage at the drain terminal 306 to a safe level so that the GaN FET 302 does not experience breakdown.

Figure 4:
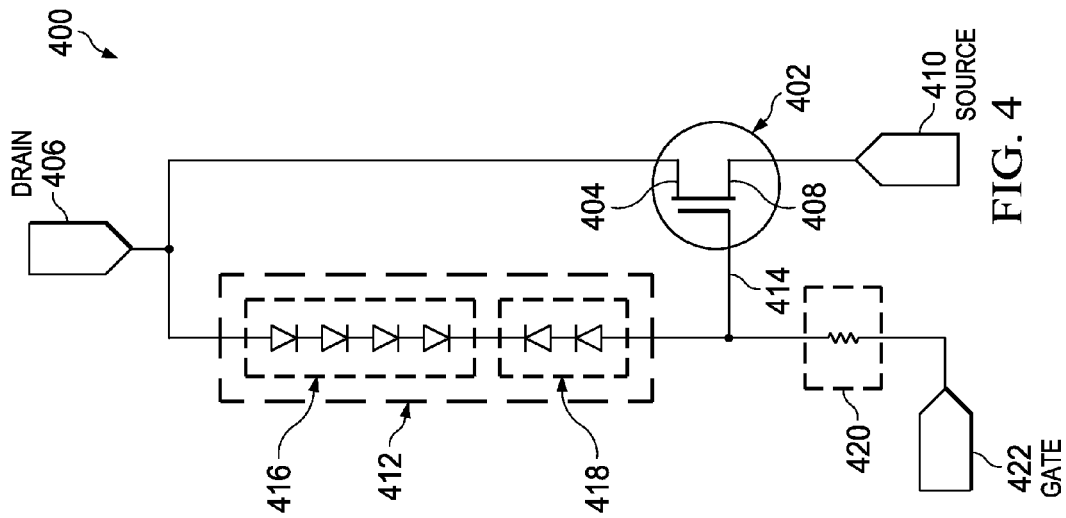

Referring to FIG. 4, a semiconductor device 400 includes a depletion mode GaN FET 402 with a drain node 404 of the GaN FET 402 connected to a drain terminal 406 of the semiconductor device 400. A source node 408 of the GaN FET 402 is connected to a source terminal 410 of the semiconductor device 400, which may be a ground terminal. A breakdown voltage of the GaN FET 402 may be, for example, 200 volts to 600 volts.

An overvoltage clamping component 412 is connected between the drain node 404 of the GaN FET 402 and a gate node 414 of the GaN FET 402. In FIG. 4 the overvoltage clamping component 412 is depicted as a plurality of diodes, including forward biased diodes 416 and reverse biased diodes 418. The overvoltage clamping component 412 is configured so that a breakdown voltage of the overvoltage clamping component 412 is less than a breakdown voltage of the GaN FET 402, for example as described in reference to FIG. 1. The overvoltage clamping component 412 may include, for example, silicon pn junction diodes, silicon schottky diodes, GaN schottky diodes, AlGaN schottky diodes or InAlGaN schottky diodes. The overvoltage clamping component 412 conducts significant current when the reverse biased diodes 418 break down.

A voltage dropping component 420 is connected between the gate node 414 and a gate terminal 422 of the semiconductor device 400. In FIG. 4, the voltage dropping component 420 is depicted as a resistor. Current from the overvoltage clamping component 412 flows through the voltage dropping component 420. An impedance of the voltage dropping component 420 is selected to provide a desired on-state bias at the gate node 414 when the overvoltage clamping component 412 is in breakdown.

During operation of the semiconductor device 400, the GaN FET 402 may be turned off by applying a suitable off-state bias at the gate terminal 422. If a voltage at the drain terminal 406 exceeds the breakdown voltage of the overvoltage clamping component 412, the overvoltage clamping component 412 conducts significant current which flows through the voltage dropping component 420 to provide a desired on-state voltage at the gate node 414, turning on the GaN FET 402. The GaN FET 402 in the on-state drops the voltage at the drain terminal 406 to a safe level so that the GaN FET 402 does not experience breakdown.

Referring to FIG. 5, a semiconductor device 500 includes an enhancement mode GaN FET 502 with a drain node 504 of the GaN FET 502 connected to a drain terminal 506 of the semiconductor device 500. A source node 508 of the GaN FET 502 is connected to a source terminal 510 of the semiconductor device 500, which may be a ground terminal.

An overvoltage clamping component 512 is connected between the drain node 504 of the GaN FET 502 and a gate node 514 of the GaN FET 502. In FIG. 5 the overvoltage clamping component 512 is depicted as a plurality of forward diodes 516. The overvoltage clamping component 512 is configured so that significant current is conducted at a turn-on voltage which is less than a breakdown voltage of the GaN FET 502. The forward diodes 516 are configured to conduct insignificant current at drain voltages less than the turn-on voltage. Forming the forward diodes 516 of GaN may provide desired limits of current at drain voltages below the turn-on voltage.

A voltage dropping component 520 is connected between the gate node 514 and a gate terminal 522 of the semiconductor device 500. In FIG. 5, the voltage dropping component 520 is depicted as a metal oxide semiconductor (MOS) transistor, in this example an NMOS transistor. Current from the overvoltage clamping component 512 flows through the voltage dropping component 520. An impedance of the voltage dropping component 520 is selected to provide a desired on-state bias at the gate node 514 when the overvoltage clamping component 512 is in breakdown.

Operation of the semiconductor device 500 is similar to operation of the semiconductor device 400 discussed in reference to FIG. 4. A gate bias of the NMOS transistor in the voltage dropping component 520 may be adjusted during breakdown of the overvoltage clamping component 512 to provide a desired on-state voltage at the gate node 514 of the GaN FET 502.

Figure 7:
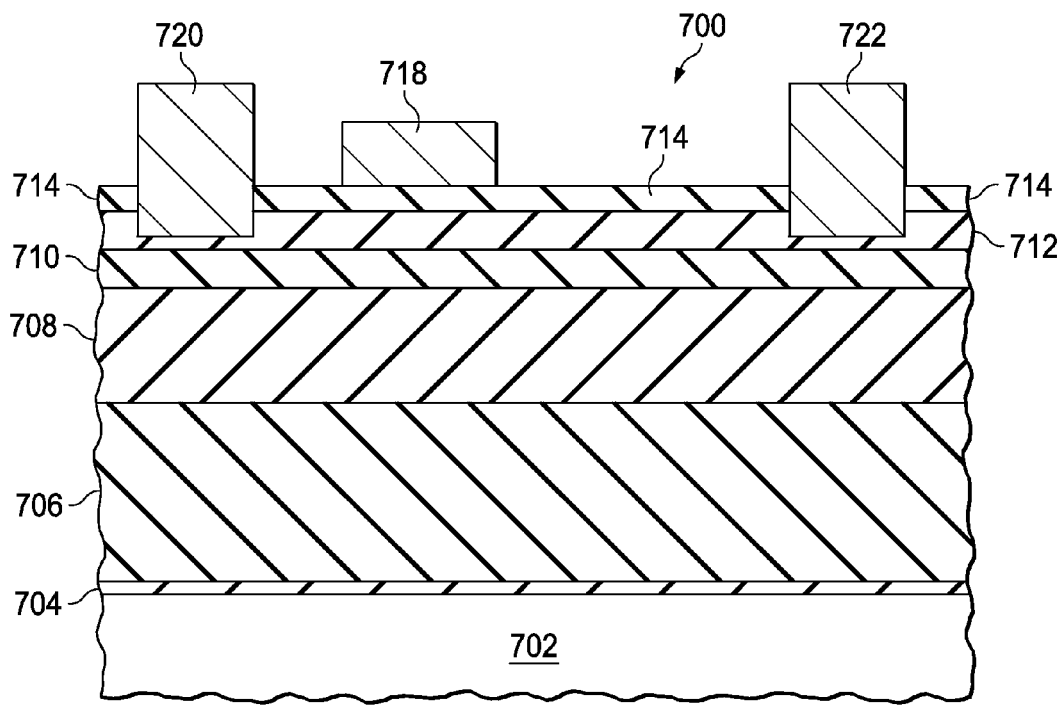
Figure 8:
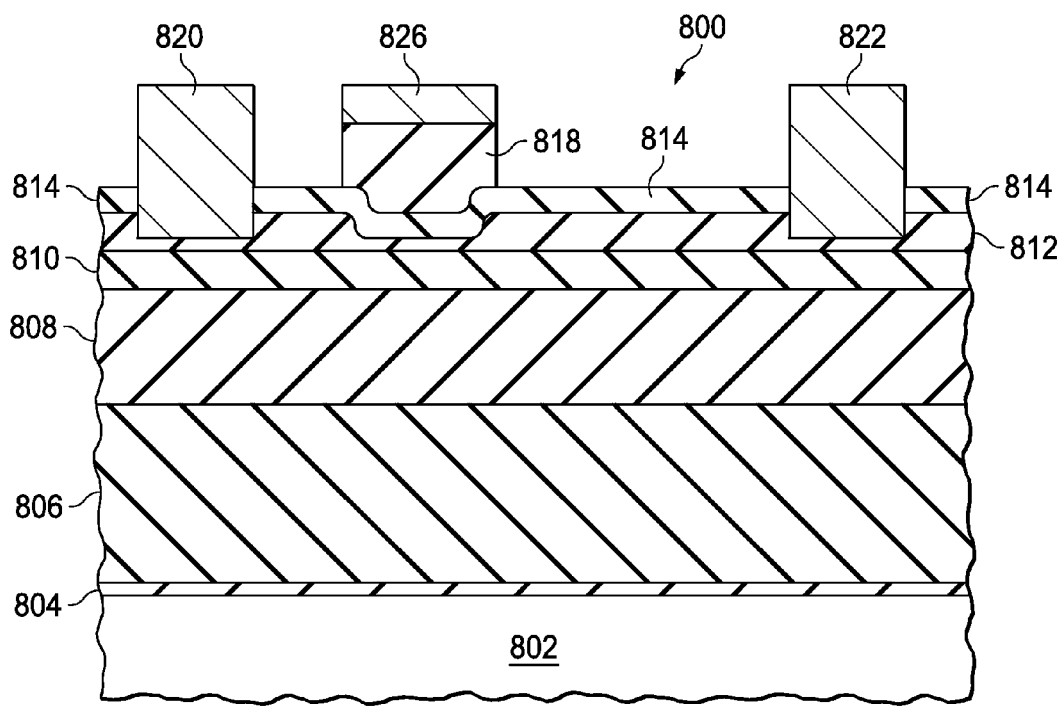

FIG. 6 through FIG. 8 are cross sections of exemplary GaN FETs according to embodiments, for example those discussed in reference to FIG. 1 through FIG. 5. Referring to FIG. 6, a depletion mode GaN FET 600 is formed on a silicon substrate 602. A mismatch isolation layer 604 is formed on the silicon substrate 602. The mismatch isolation layer 604 may be, for example, 100 to 300 nanometers of aluminum nitride.

A buffer layer 606 is formed on the mismatch isolation layer 604. The buffer layer 606 may be, for example, 1 to 7 microns thick and include a stack of graded layers of $Al_xGa_{1-x}N$ which is aluminum rich at the mismatch isolation layer 604 and gallium rich at a top surface of the buffer layer 606.

An electrical isolation layer 608 is formed on the buffer layer 606. The electrical isolation layer 608 may be, for example, 300 nanometers to 2000 nanometers of semi-insulating gallium nitride. The electrical isolation layer 608 may be, for example, semi-insulating to provide a desired level of electrical isolation between layers below the electrical isolation layer 608 and layers above the electrical isolation layer 608.

A low-defect layer 610 is formed on the electrical isolation layer 608. The low-defect layer 610 may be, for example, 25 to 1000 nanometers of gallium nitride. The low-defect layer 610 may be formed so as to minimize crystal defects which may have an adverse effect on electron mobility, which may result in the low-defect layer 610 being doped with carbon, iron or other dopant species, for example with a doping density less than $10^{17}$ $cm^{-3}$.

A barrier layer 612 is formed on the low-defect layer 610. The barrier layer 612 may be, for example, 2 to 30 nanometers of $Al_xGa_{1-x}N$ or $In_xAl_yGa_{1-x-y}N$. A composition of the barrier layer 612 may be, for example, 24 to 28 percent aluminum nitride and 72 to 76 percent gallium nitride. Forming the barrier layer 612 on the low-defect layer 610 generates a two-dimensional electron gas in the low-defect layer 610 just below the barrier layer 612 with an electron density of, for example, $1 \times 10^{12}$ to $2 \times 10^{13}$ $cm^{-2}$.

An optional cap layer 614 may be formed on the barrier layer 612. The cap layer 614 may be, for example, 2 to 5 nanometers of gallium nitride.

A gate dielectric layer 616 is formed over the cap layer 614 if present and over the barrier layer 612. The gate dielectric layer 616 may be, for example, 10 to 20 nanometers of silicon nitride formed by low pressure chemical vapor deposition (LPCVD) or plasma enhanced chemical vapor deposition (PECVD). In other version of the instant example, the gate dielectric layer 616 may include one or more layers of silicon nitride, silicon dioxide, silicon oxynitride and/or aluminum oxide.

A gate 618 is formed on the gate dielectric layer 616. The gate 618 may be, for example, 100 to 300 nanometers of tungsten or titanium tungsten. The gate 618 may be patterned using an etch process or a liftoff process.

A source contact 620 is formed through the gate dielectric layer 616 and extending into the barrier layer 612, so as to form a tunneling connection to the two-dimensional electron gas in the low-defect layer 610. The source contact 620 may be laterally separated from the gate 618 by, for example, 500 to 1500 nanometers. Similarly, a drain contact 622 is formed through the gate dielectric layer 616 and extending into the barrier layer 612, so as to form a tunneling connection to the two-dimensional electron gas. The drain contact 622 is laterally separated from the gate 618 by a distance which depends on a maximum operating voltage of the GaN FET 600. For example, in a GaN FET 600 designed for a maximum operating voltage of 200 volts, the drain contact 622 may be laterally separated from the gate 618 by 1 to 8 microns. In a GaN FET 600 designed for a maximum operating voltage of 600 volts, the drain contact 622 may be laterally separated from the gate 618 by 3 to 20 microns. The silicon substrate 602 may possibly be electrically connected to the source contact 620, or may possibly be electrically connected to the drain contact 622. The GaN FET 600 may be formed in and on a different layer structure that that depicted in FIG. 6. An enhancement mode GaN FET may be formed by forming a gate recess in the barrier layer 612 and forming the optional cap layer 614, the gate dielectric layer 616 and the gate 618 in the gate recess, so as to place a bottom surface of the gate 618 closer to a top surface of the low-defect layer 610.

The enhancement mode GaN FET 600 is normally off when no gate bias is applied, which may be advantageous for switching power supply applications or medical applications. A positive bias on the gate 618 with respect to the source contact 620 above a threshold voltage will turn the enhancement mode GaN FET 600 on. Conversely, a bias on the gate 618 with respect to the source contact 620 that is less than the threshold voltage will turn the enhancement mode GaN FET 600 off. Forming the gate dielectric layer 616 between the gate 618 and the two-dimensional electron gas advantageously provides a margin of overvoltage protection for a gate bias voltage source. The gate 618 may be biased several volts past threshold without damaging the enhancement mode GaN FET 600.

Referring to FIG. 7, a depletion mode GaN FET 700 is formed on a silicon substrate 702, for example with a mismatch isolation layer 704, a buffer layer 706, a electrical isolation layer 708, an low-defect layer 710, a barrier layer 712 and possibly an optional cap layer 714, as described in reference to FIG. 6. Forming the barrier layer 712 on the low-defect layer 710 generates a two-dimensional electron gas in the low-defect layer 710 just below the barrier layer 712. A metal gate 718 is formed on the cap layer 714 if present or on the barrier layer 712 if no cap layer is present. The metal gate 718 may be formed as described in reference to FIG. 6. A source contact 720 and a drain contact 722 are formed to make tunneling connections to the two-dimensional electron gas, as described in reference to FIG. 6. The GaN FET 700 may be formed in and on a different layer structure that that depicted in FIG. 7. An enhancement mode GaN FET may be formed by forming a gate recess in the barrier layer 712 and forming the optional cap layer 714 and the gate 718 in the gate recess.

The depletion mode GaN FET 700 is normally on when no gate bias is applied. A negative bias on the gate 718 with respect to the source contact 720 below a threshold voltage will turn the depletion mode GaN FET 700 off. The depletion mode GaN FET 700 advantageously has a simpler fabrication sequence than other GaN FETs with semiconductor gates or gate dielectric layers.

Referring to FIG. 8, an enhancement mode GaN FET 800 is formed on a silicon substrate 802, with a mismatch isolation layer 804, a buffer layer 806, a electrical isolation layer 808, an low-defect layer 810, and a barrier layer 812 with a gate recess and possibly an optional cap layer 814, as described in reference to FIG. 6. Stress from the barrier layer 812 generates a two-dimensional electron gas in the low-defect layer 810 just below the barrier layer 812. A p-type semiconductor gate 818 is formed on the cap layer 814 if present or on the barrier layer 812 if no cap layer is formed. The semiconductor gate 818 includes one or more layers of III-N semiconductors, such as GaN, $Al_xGa_{1-x}N$, $In_xAl_yGa_{1-x-y}N$, $In_xAl_{1-x}N$ and AlN. The semiconductor gate 818 may have a metal gate cap 826 which forms an ohmic or schottky contact to the semiconductor gate 818 to improve electrical performance.

A source contact 820 and a drain contact 822 are formed to make tunneling connections to the two-dimensional electron gas, as described in reference to FIG. 6. The GaN FET 800 may be formed in and on a different layer structure that that depicted in FIG. 8. A depletion mode GaN FET may be formed by omitting the gate recess.

The enhancement mode GaN FET 800 operates similarly to the enhancement mode GaN FET 600 of FIG. 6. On-state bias on the semiconductor gate 818 is limited to about 6 volts so as not to induce excess gate current through the pn junction between the semiconductor gate 818 and the barrier layer 812. The semiconductor gate 818 may advantageously provide the enhancement mode GaN FET 800 with higher reliability compared to other enhancement mode GaN FET architectures.

Figure 9:
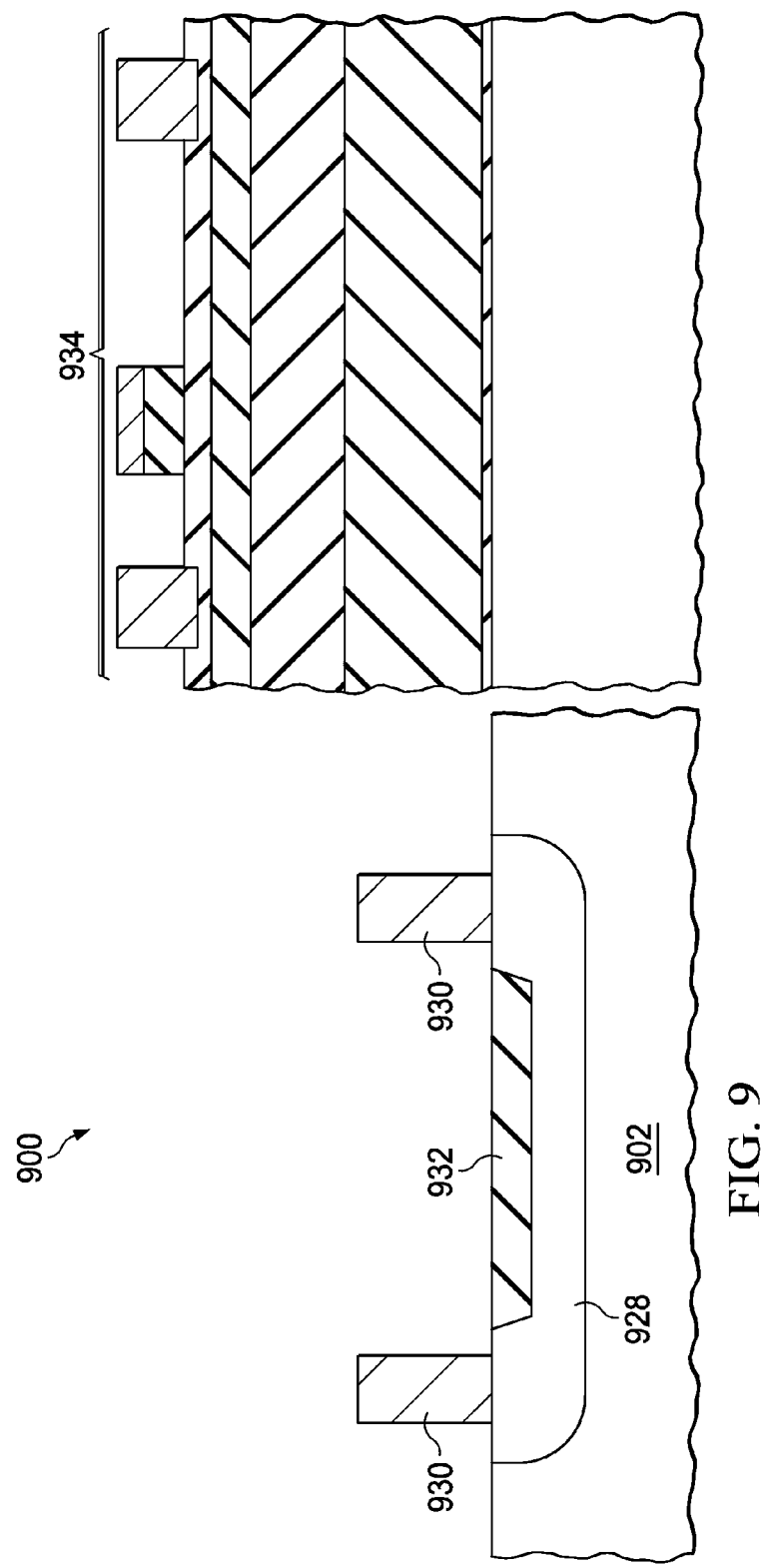
FIG. 9 through FIG. 12 are cross sections of semiconductor devices with examples of voltage dropping components.

FIG. 9 through FIG. 12 are cross sections of semiconductor devices with examples of voltage dropping components as described in reference to FIG. 1 through FIG. 5. Referring to FIG. 9, a semiconductor device 900 is formed in and on a silicon substrate 902. A voltage dropping component in the form of a well resistor 928 is formed in the silicon substrate 902; the well resistor 928 has an opposite conductivity type from the silicon substrate 902. Resistor contacts 930 are formed to electrically connect the well resistor 928 to a GaN FET 934. The well resistor 928 may be formed below field oxide 932 to provide a desired sheet resistance. The well resistor 928 may be formed, for example, by ion implantation. The well resistor 928 may be integrated with the GaN FET 934 as depicted in FIG. 9, or may be formed on a separate substrate. Alternatively, the well resistor 928 may be formed in a silicon layer formed over the III-N semiconductor layers of the GaN FET 934. Forming the voltage dropping component as a well resistor may provide a desired reliability and current capacity compared to other resist configurations.

Figure 10:
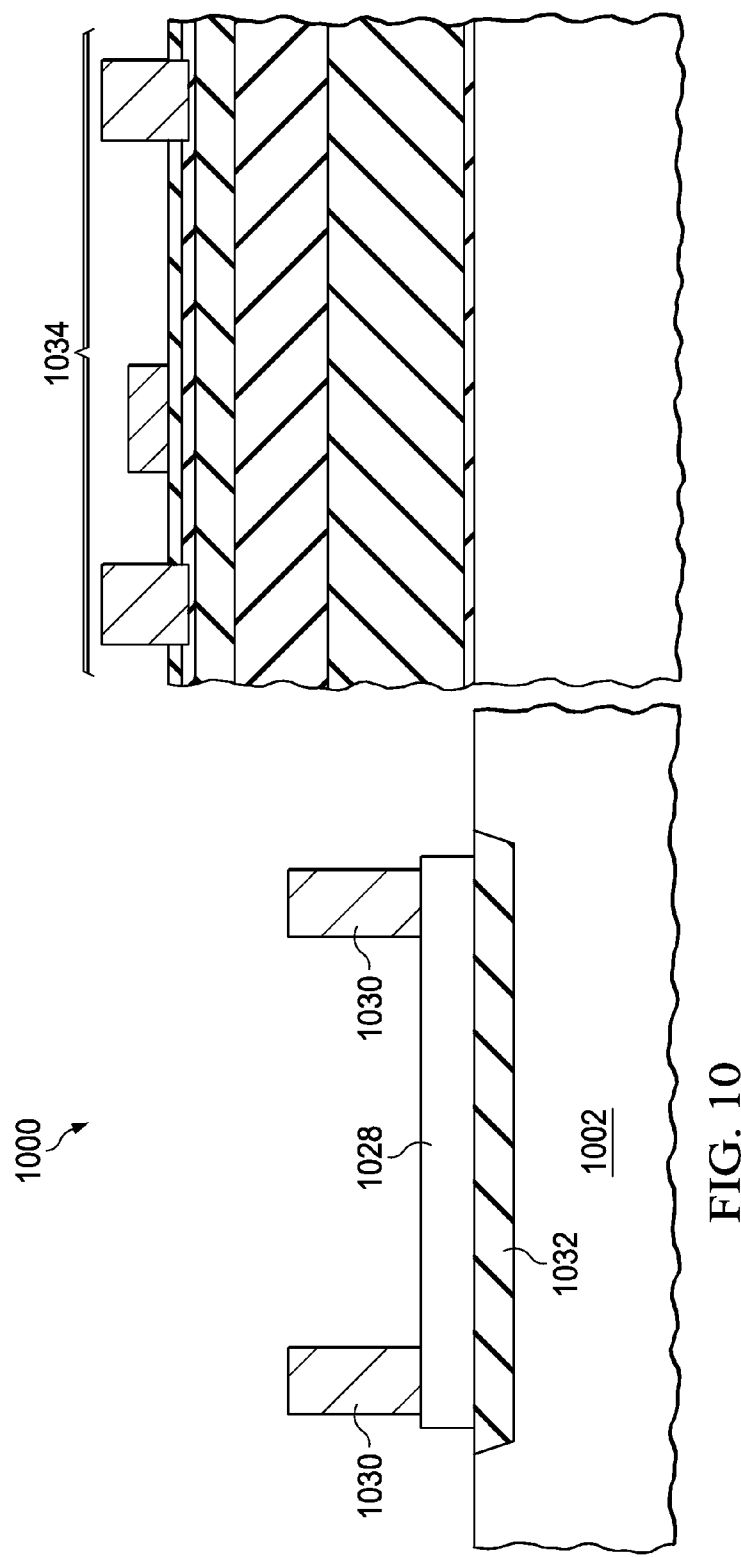

Referring to FIG. 10, a semiconductor device 1000 is formed in and on a silicon substrate 1002. A voltage dropping component in the form of a thin film resistor 1028 is formed over the silicon substrate 1002, possibly over field oxide 1032. Resistor contacts 1030 are formed to electrically connect the thin film resistor 1028 to a GaN FET 1034. The thin film resistor 1028 may have a resistor body of polycrystalline silicon, commonly referred to as polysilicon, a refractory metal such as nickel chromium alloy or silicon chromium alloy, or other electrically conductive material suitable for forming the thin film resistor 1028. The thin film resistor 1028 may be integrated with the GaN FET 1034 as depicted in FIG. 10, or may be formed on a separate substrate. Alternatively, the thin film resistor 1028 may be formed on a silicon layer formed over the III-N semiconductor layers of the GaN FET 1034. Forming the voltage dropping component as a thin film resistor may provide a desired flexibility of sheet resistance compared to other resist configurations.

Figure 11:
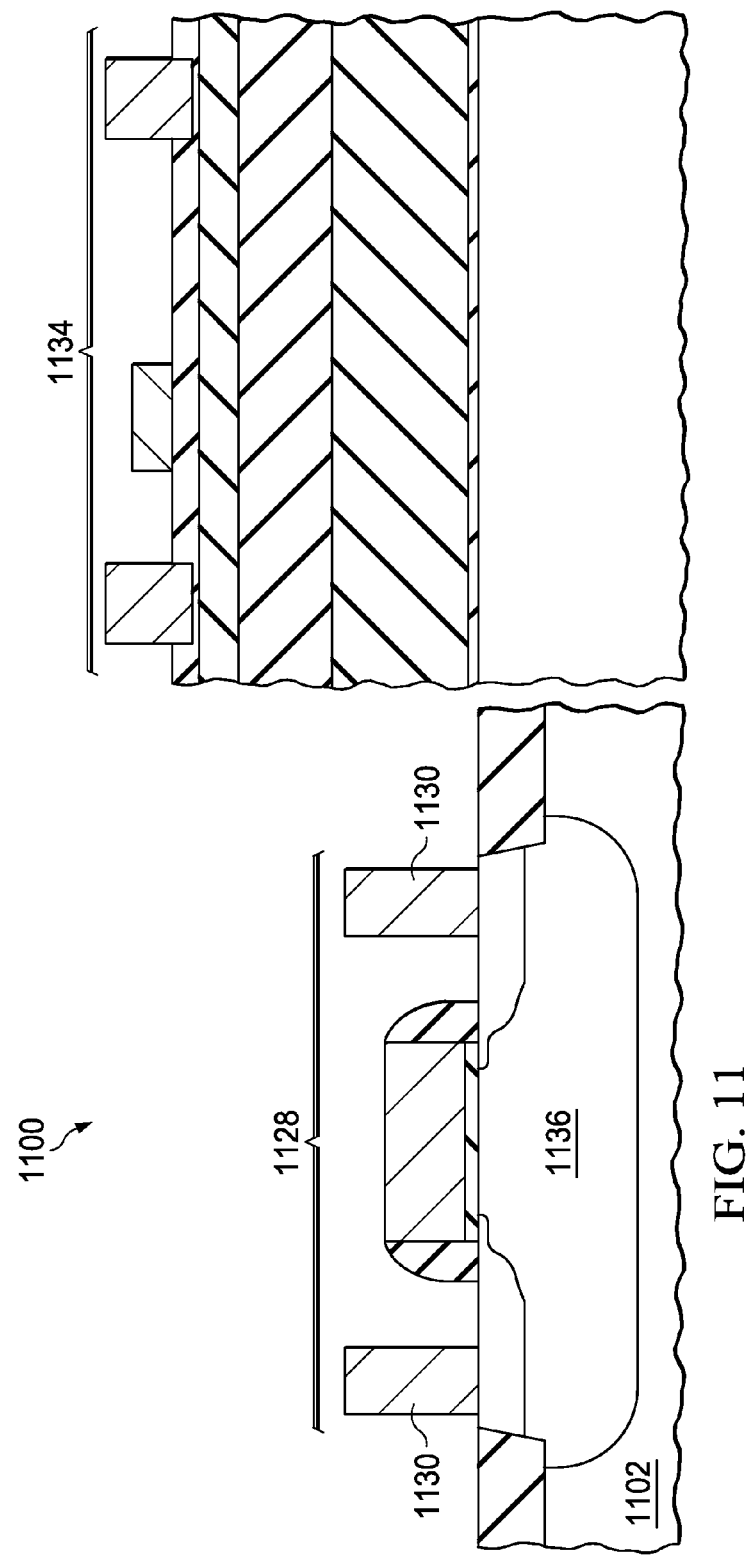

Referring to FIG. 11, a semiconductor device 1100 is formed in and on a silicon substrate 1102. A voltage dropping component in the form of a metal oxide semiconductor (MOS) transistor 1128 is formed in and on the silicon substrate 1102, possibly in an optional well 1136. Source and drain contacts 1130 are formed to electrically connect the MOS transistor 1128 to a GaN FET 1134. The MOS transistor 1128 may be an NMOS transistor or a p-channel metal oxide semiconductor (PMOS) transistor. The MOS transistor 1128 may be biased in an always-on state, or may be biased depending on current through an overvoltage clamping component, not shown, connected in series. The MOS transistor 1128 may be integrated with the GaN FET 1134 as depicted in FIG. 11, or may be formed on a separate substrate. Alternatively, the MOS transistor 1128 may be formed on a silicon layer formed over the III-N semiconductor layers of the GaN FET 1134. Forming the voltage dropping component as a MOS transistor may provide a flexible voltage dropping action compared to a fixed resistor.

Figure 12:
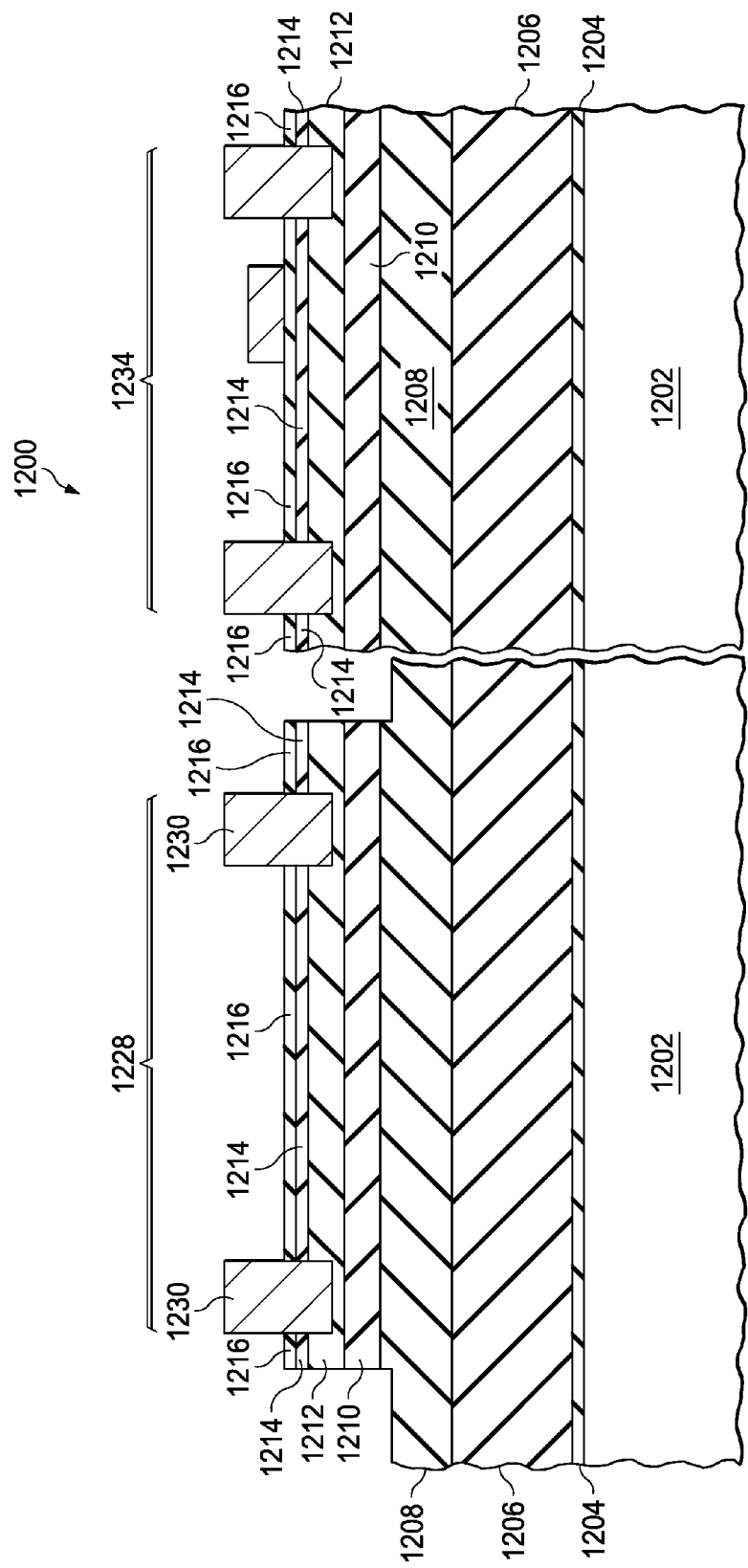

Referring to FIG. 12, a semiconductor device 1200 is formed in and on a silicon substrate 1202. A layer stack of III-N semiconductor materials is formed on the silicon substrate to support a GaN FET 1234 and a two-dimensional electron gas resistor 1228 providing a voltage dropping component for the GaN FET 1234. The layer stack of III-N semiconductor materials may include the exemplary layers discussed in reference to FIG. 6: a mismatch isolation layer 1204, a buffer layer 1206, a electrical isolation layer 1208, an low-defect layer 1210, a barrier layer 1212, possibly an optional cap layer 1214 and possibly an optional dielectric layer 1216 such as silicon nitride. Stress from the barrier layer 1212 generates a two-dimensional electron gas in the low-defect layer 1210 just below the barrier layer 1212. A portion of the two-dimensional electron gas forms a channel conductive layer in the GaN FET 1234. Another portion of the two-dimensional electron gas forms a resistor body in the two-dimensional electron gas resistor 1228. The two-dimensional electron gas resistor 1228 may have a sheet resistivity of, for example, 300 to 5000 ohms per square. Resistor contacts 1230 are formed to make tunneling connections to the two-dimensional electron gas forming the resistor body. The two-dimensional electron gas resistor 1228 may optionally be isolated in a mesa structure as depicted in FIG. 12, or may be part of a monolithic architecture. Forming the two-dimensional electron gas resistor 1228 to use a portion of the same two-dimensional electron gas as used by the GaN FET 1234 may provide a simpler and lower cost fabrication process sequence for the semiconductor device 1200 than other integrated configurations.

Figure 13:
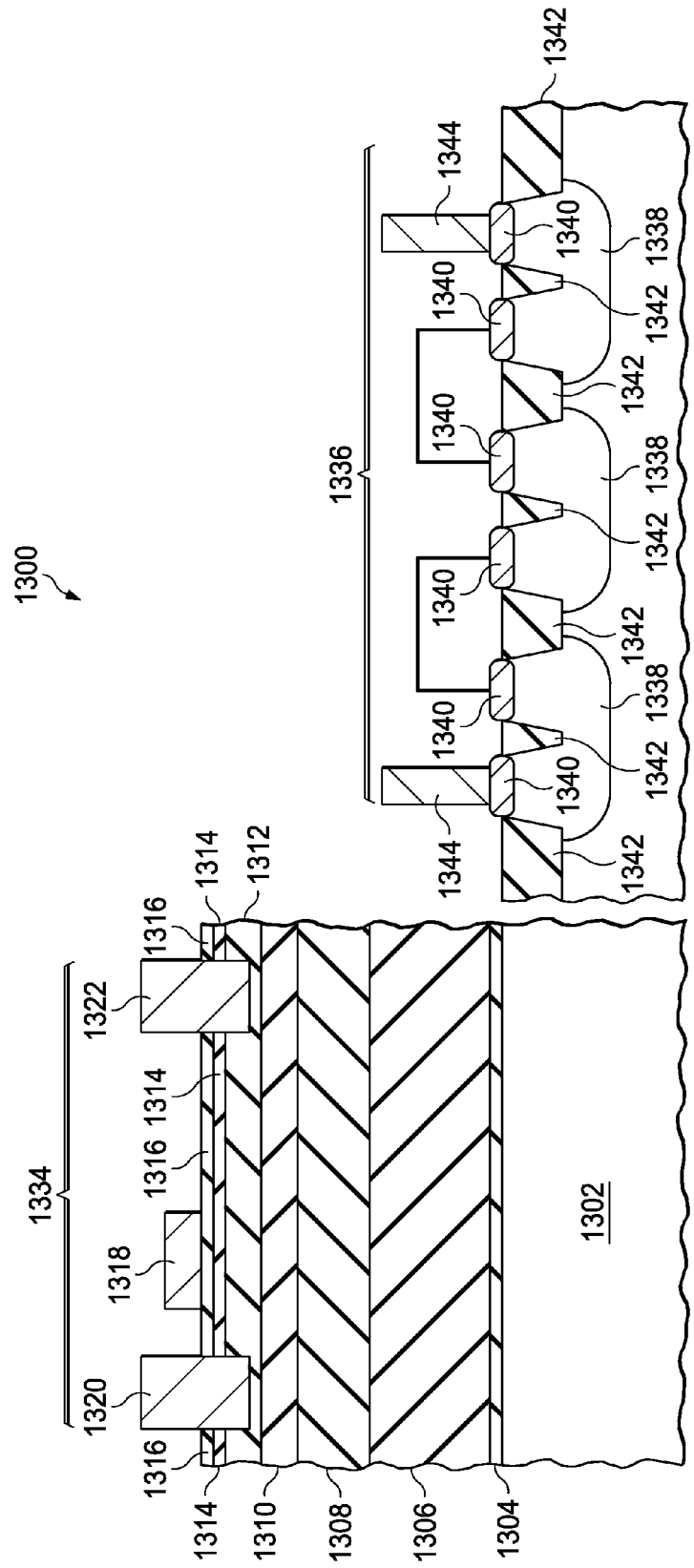
FIG. 13 through FIG. 15 are cross sections of semiconductor devices with examples of overvoltage clamping components.
Figure 14:
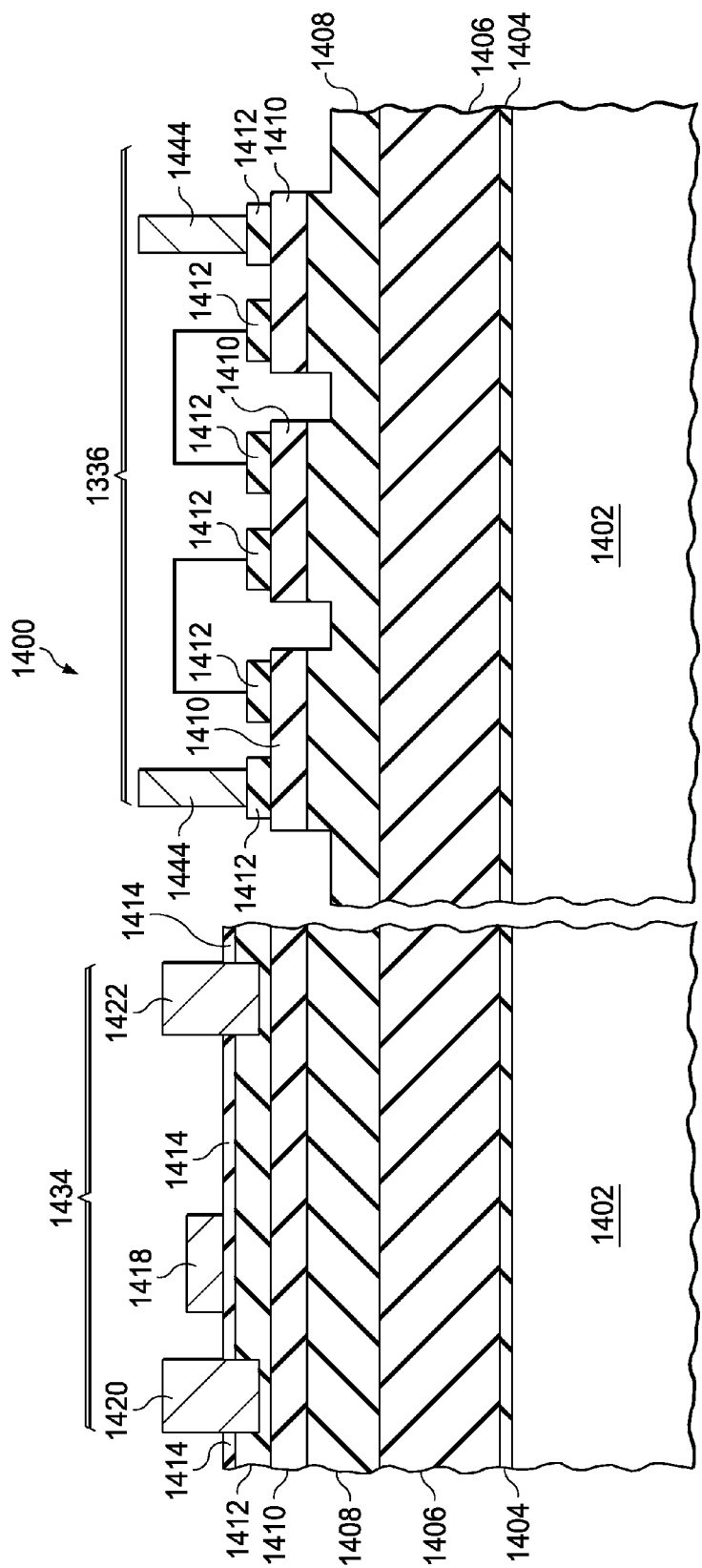
Figure 15:
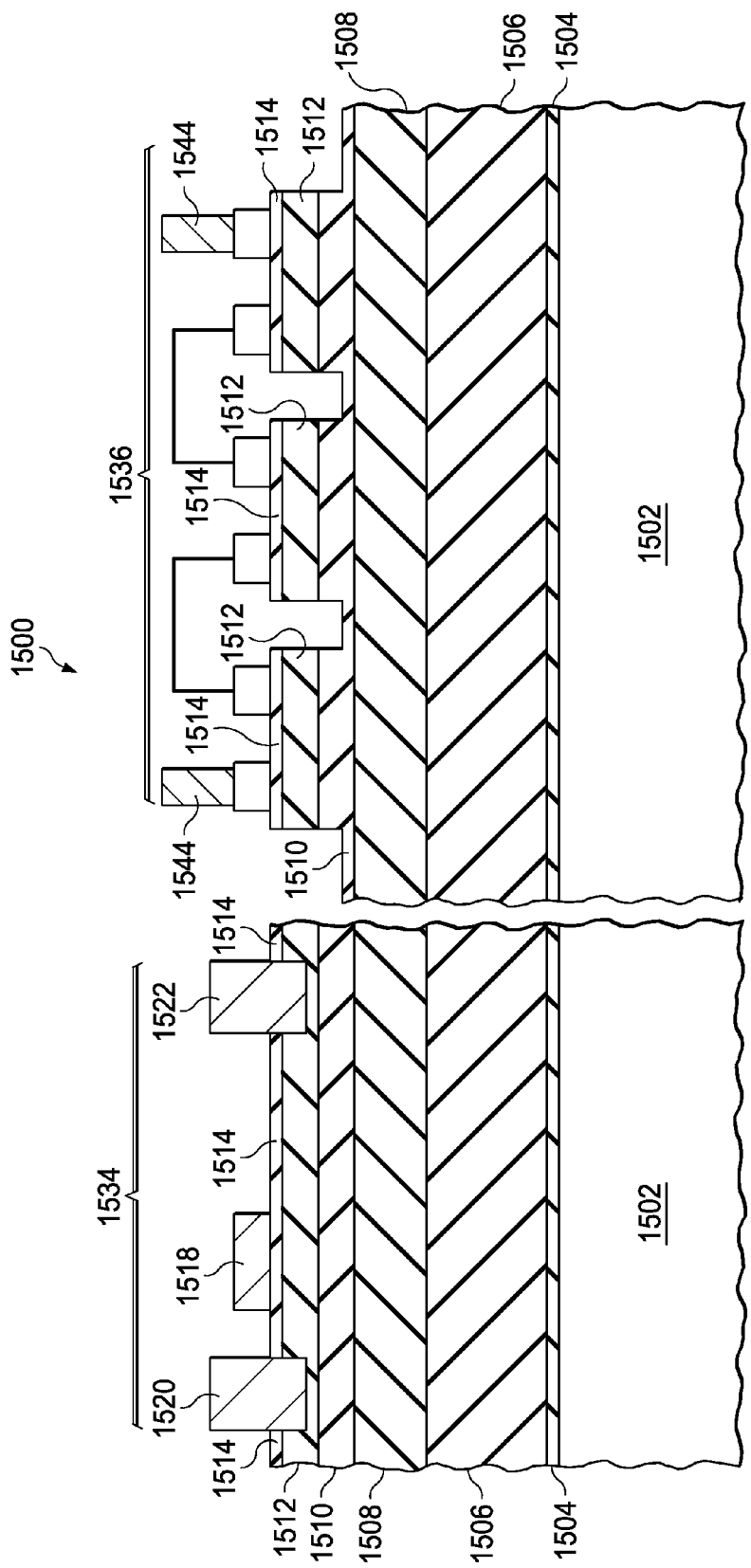

FIG. 13 through FIG. 15 are cross sections of semiconductor devices with examples of overvoltage clamping components as described in reference to FIG. 1 through FIG. 5. Referring to FIG. 13, a semiconductor device 1300 is formed in and on a silicon substrate 1302. A GaN FET 1334 is formed on the silicon substrate 1302, for example with a mismatch isolation layer 1304, a buffer layer 1306, a electrical isolation layer 1308, an low-defect layer 1310, a barrier layer 1312 optionally a cap layer 1314, optionally a gate dielectric layer 1316, a gate 1318, source contact 1320 and drain contact 1322, as described in reference to FIG. 6.

An overvoltage clamping component in the form of a plurality of forward and reverse schottky diode pairs 1336 is formed in and on the silicon substrate 1302. The schottky diodes 1336 include n-type doped regions 1338 in the silicon substrate 1302 which provide cathodes of the schottky diodes 1336. Metal or metal silicide layers 1340 on the doped regions 1338 provide anodes of the schottky diodes 1336. The doped regions 1338 may be laterally isolated by field oxide 1342. The forward and reverse schottky diode pairs 1336 are electrically connected in series as depicted in FIG. 13, for example by metal interconnects of the semiconductor device 1300. Diode contacts 1344 are formed on end diodes of the plurality of schottky diode pairs 1336 to provide electrical connection to the GaN FET 1334. Alternatively, the plurality of forward and reverse schottky diode pairs 1336 may be formed on a silicon layer formed over the III-N semiconductor layers of the GaN FET 1334. Forming the overvoltage clamping component as silicon schottky diodes may provide a desirable balance between simplicity of fabrication and current capacity compared to other configurations.

Referring to FIG. 14, a semiconductor device 1400 is formed in and on a silicon substrate 1402. A GaN FET 1434 is formed on the silicon substrate 1402, for example with a mismatch isolation layer 1404, a buffer layer 1406, a electrical isolation layer 1408, an low-defect layer 1410, a barrier layer 1412 optionally a cap layer 1414, a gate 1418, source contact 1420 and drain contact 1422, as described in reference to FIG. 6. An overvoltage clamping component in the form of a plurality of forward and reverse III-N diode pairs 1436 is formed in the low-defect layer 1410 and the barrier layer 1412. The diodes 1336 include n-type mesa regions in the low-defect layer 1410 which provide cathodes of the diodes 1436. P-type islands of the barrier layer 1412 on the mesa regions in the low-defect layer 1410 provide anodes of the diodes 1436. The forward and reverse schottky diode pairs 1436 are electrically connected in series as depicted in FIG. 14, for example by metal interconnects of the semiconductor device 1400. Diode contacts 1442 are formed on end diodes of the plurality of diode pairs 1436 to provide electrical connection to the GaN FET 1434. Forming the overvoltage clamping component as III-N diodes may advantageously reduce a fabrication cost and complexity of the semiconductor device 1400 compared to other configurations.

Referring to FIG. 15, a semiconductor device 1500 is formed in and on a silicon substrate 1502. A GaN FET 1534 is formed on the silicon substrate 1502, for example with a mismatch isolation layer 1504, a buffer layer 1506, a electrical isolation layer 1508, an low-defect layer 1510, a barrier layer 1512, a cap layer 1514, a metal gate 1518 of a metal gate layer on the barrier layer 1512, source contact 1520 and drain contact 1522, as described in reference to FIG. 7. An overvoltage clamping component in the form of a plurality of forward and reverse III-N schottky diode pairs 1536 is formed in and on the barrier layer 1512. The schottky diodes 1536 include mesa regions in the barrier layer 1512 which provide cathodes of the diodes 1536. Metal islands 1546 of the metal gate layer on the mesa regions in the barrier layer 1512 provide anodes of the diodes 1536. The forward and reverse schottky diode pairs 1536 are electrically connected in series as depicted in FIG. 15. Diode contacts 1542 are formed on end diodes of the plurality of diode pairs 1536 to provide electrical connection to the GaN FET 1534. Forming the overvoltage clamping component as III-N schottky diodes may advantageously reduce a fabrication cost and complexity of the semiconductor device 1500 with the metal gate 1518 compared to other configurations.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
a gallium nitride field effect transistor (GaN FET);
an overvoltage clamping component, a first end of said overvoltage clamping component being electrically coupled to a drain node of said GaN FET, said overvoltage clamping component being configured to conduct insignificant current when a voltage at said drain node is less than a safe voltage limit which is less than a breakdown voltage of said GaN FET; said overvoltage clamping component being further configured to conduct significant current when said voltage at said drain node of said GaN FET rises above said safe voltage limit; and
a voltage dropping component, a first end of said voltage dropping component being electrically coupled to a second end of said overvoltage clamping component, a second end of said voltage dropping component being electrically coupled to a terminal for a bias potential which provides an off-state bias for said GaN FET, said voltage dropping component being configured to provide a voltage drop which increases as current from said overvoltage clamping component increases;
said semiconductor device being configured to turn on said GaN FET when said voltage drop across said voltage dropping component reaches a threshold value.

2. The semiconductor device of claim 1, in which:
said first end of said voltage dropping component is electrically coupled to a gate node of said GaN FET; and
said second end of said voltage dropping component is electrically coupled to a gate terminal of said semiconductor device.

3. The semiconductor device of claim 1, in which:
said GaN FET is a depletion mode GaN FET;
a source node of said GaN FET is electrically coupled to a drain node of an n-channel metal oxide semiconductor (NMOS) transistor;
a gate node of said GaN FET is electrically coupled to a source node of said NMOS transistor; and
said second end of said voltage dropping component is electrically coupled to a gate node of said NMOS transistor.

4. The semiconductor device of claim 1, in which said overvoltage clamping component includes a plurality of diodes electrically coupled in series.

5. The semiconductor device of claim 4, in which said plurality of diodes is configured as a plurality of forward and reverse diode pairs.

6. The semiconductor device of claim 4, in which said diodes are formed in an low-defect layer comprising gallium nitride and a barrier layer comprising $Al_xGa_{1-x}N$, said GaN FET being disposed in a portion of said low-defect layer and said barrier layer.

7. The semiconductor device of claim 4, in which said diodes are formed in a barrier layer comprising $Al_xGa_{1-x}N$ and a metal gate layer, said GaN FET being disposed in a portion of said barrier layer and having a metal gate of said metal gate layer.

8. The semiconductor device of claim 1, in which said voltage dropping component is a resistor.

9. The semiconductor device of claim 8, in which said resistor has a resistor body in a two-dimensional electron gas in an low-defect layer comprising gallium nitride, said GaN FET being disposed in a portion of said low-defect layer and having a channel conductive layer in said two-dimensional electron gas.

10. The semiconductor device of claim 1, in which said voltage dropping component is a metal oxide semiconductor (MOS) transistor.

* * * * *